United States Patent [19]

Suzuki et al.

[11] Patent Number: 5,684,094
[45] Date of Patent: Nov. 4, 1997

[54] CURABLE RESIN COMPOSITION

[75] Inventors: Mikiko Suzuki; Jo Kawamura; Hiroshi Iwakiri; Fumio Kawakubo, all of Hyogo, Japan

[73] Assignee: Kanegafuchi Kagaku Kogyo Kabushiki Kaisha, Osaka, Japan

[21] Appl. No.: 400,101

[22] Filed: Mar. 6, 1995

[30] Foreign Application Priority Data

Mar. 7, 1994 [JP] Japan ..................... 6-59786

[51] Int. Cl.⁶ ..................... C08L 71/02; C08G 65/32
[52] U.S. Cl. ............ 525/403; 525/410; 525/476; 524/588
[58] Field of Search ..................... 525/403, 476, 525/410; 524/588

[56] References Cited

U.S. PATENT DOCUMENTS 4,657,986  4/1987  Isayama et al. ............ 525/407

FOREIGN PATENT DOCUMENTS

| | | |
|---|---|---|
| 0 476 150 A1 | 3/1992 | European Pat. Off. . |
| 0 584 978 A1 | 3/1994 | European Pat. Off. . |
| 01-165847 | 6/1987 | Japan . |
| 63-327629 | 11/1988 | Japan . |
| WO 91 15536 | 10/1991 | WIPO . |

OTHER PUBLICATIONS

Database WPI, Derwent Publications Ltd., AN 88–360479, Feb. 22, 1989.

Database WPI, Derwent Publications Ltd., AN 89–231033/32, Oct. 4, 1989.

*Primary Examiner*—Ralph H. Dean
*Attorney, Agent, or Firm*—Armstrong, Westerman, Hattori, McLeland & Naughton

[57] ABSTRACT

A curable resin composition comprising (a) an oxyalkylene polymer comprising at least one reactive silicon group per molecule and having a number average molecular weight of not less than 3000 and an Mw/Mn ratio of not higher than 1.6, (b) a curing catalyst for the oxyalkylene polymer containing at least one reactive silicon group per molecule, (c) an epoxy resin, and (d) a ketimine; and a curable resin composition further comprises (e) a reactive silicon group-containing silane compound in addition to (a) to (d).

13 Claims, No Drawings

CURABLE RESIN COMPOSITION

FIELD OF THE INVENTION

The present invention relates to a curable resin composition containing a novel oxyalkylene polymer having a reactive silicon group and an epoxy resin.

BACKGROUND OF THE INVENTION

Epoxy resins have found wide utility as molding materials for various articles, adhesives, coatings, plywood, laminated plates, and the like. The drawback of epoxy resins observed in the utility in general is that the cured product is brittle, and, when used as an adhesive, the peel strength is small.

On the other hand, an oxyalkylene polymer having a reactive silicon group has the interesting characteristic that it is cured at room temperature to provide a rubbery elastic body. However one disadvantage is that a cured product thereof usually has small strength and is therefore limited in use.

In order to overcome the brittleness of a cured epoxy resin and the lack of strength of a cured oxyalkylene polymer, a curable resin composition comprising an epoxy resin and an oxyalkylene polymer having a reactive silicon group has been suggested as disclosed, e.g., in JP-A-61-247723 and JP-A-61-268720 (the term "JP-A" as used herein means an "unexamined published Japanese patent application"). Most resin compositions of this type are composed of two packs, each of which contains a main component and a curing agent. Some of them are more workable one-pack types in which a main component and a ketimine as a curing agent are previously mixed as described in JP-A-63-273629, JP-A-4-1220, and JP-A-5-271389.

It has been difficult to obtain a cured product having well-balanced properties in terms of flexibility, strength, adhesion to various substrates, and, in particular, water-resistant adhesion with a one-pack type resin composition. Conventional one-pack type resins have limited use, and a good balance between rubbery elasticity and strength has been demanded. In addition, since curing basically relies on the moisture content in air, application to uses requiring rapid curing has been difficult. The present invention overcomes the liabilities of prior known resins.

SUMMARY OF THE INVENTION

An object of the present invention is to provide a one-pack type resin composition exhibiting excellent balanced properties between rubbery elasticity and strength, rapid curability, and storage stability.

The above object is accomplished by a curable resin composition comprising (a) an oxyalkylene polymer comprising at least one reactive silicon group per molecule and having a number average molecular weight of greater than 3000 and an Mw/Mn ratio of less than or equal to 1.61, (b) a curing catalyst for said oxyalkylene polymer, (c) an epoxy resin, and (d) a ketimine; or a curable resin composition comprising (a) to (d) and (e) a reactive silicon group-containing silane compound, or further comprises (f) a desiccant.

DETAILED DESCRIPTION OF THE INVENTION

The oxyalkylene polymer which can be used in the present invention as component (a) is an organic polymer having at least one reactive silicon group and having an Mw/Mn ratio of not more than 1.6. The terminology "reactive silicon group" in the polymer denotes a silicon-containing group in which a hydrolyzable group or a hydroxyl group is bonded to the silicon atom and which is crosslinkable through silanol condensation reactions. While not meant to be limiting, typical reactive silicon groups are represented by formulae (1 or 2).

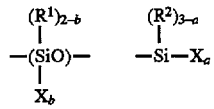

wherein $R^1$ and $R^2$ each represents a straight, branched or cyclic alkyl group having 1 to 20 carbon atoms, an aryl group having 6 to 20 carbon atoms, an aralkyl group having 7 to 20 carbon atoms or a triorganosiloxy group represented by $(R')_3SiO-$, wherein three R' groups, which may be the same or different, each represents monovalent hydrocarbon group having 1 to 20 carbon atoms or phenyl; when there are two or more $R^1$ or $R^2$ the same or different; X represents a hydroxyl group or a hydrolyzable group; when there are two or more X groups, they may be the same or different; a represents 0, 1, 2 or 3; b represents 0, 1 or 2; b for $R^1$ and b for X in each unit of formula;

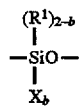

may be the same or different. The number of groups n may be from 1 to 20, satisfying $(a+\Sigma b) \geq 1$.

As used herein and in the claims, the term "alkyl" refers to a saturated, straight branched or cyclic hydrocarbon moiety having the specified number of carbon atoms. As used herein and in the claims the term "aryl" refers to an unsaturated cyclic or aromatic hydrocarbon moiety having the specified number of carbon atoms. As used herein and in the claims the term "aralkyl" refers to a saturated straight or branched hydrocarbon moiety attached to an aromatic hydrocarbon moiety, the structure having the specified number of carbon atoms.

The hydrolyzable group represented by X is not particularly limited and may be selected from conventional hydrolyzable groups known to those skilled in the art. For example, but not limited to a hydrogen atom, a halogen atom, an alkoxy group, an acyloxy group, a ketoximate group, an amino group, an amido group, an acid amido group, an amino-oxy group, a mercapto group, and an alkenyloxy group. Preferred hydrolyzable groups are a hydrogen atom, an alkoxy group, an acyloxy group, a ketoximate group, an amino group, an amido group, an amino-oxy group, a mercapto group, and an alkenyloxy group. An alkoxy group, e.g., a methoxy group, is particularly preferred for ease in handling due to its mild hydrolyzability.

One to three hydroxyl groups or hydrolyzable groups may be bonded to one silicon atom, and $(a + \Sigma b)$ is preferably 1 to 5. Where two or more hydroxyl groups or hydrolyzable groups are present per reactive silicon group, they may be the same or different.

The reactive silicon group may have one or more than one silicon atoms. A reactive silicon group in which silicon atoms are linked via a siloxane bond, etc. may have about 20 silicon atoms.

From the standpoint of availability, reactive silicon groups represented by formula (2) shown below are preferred:

wherein $R^2$, X, and a are as defined above $R^1$ and $R^2$ in formula (1) most preferably include an alkyl group, e.g., methyl or ethyl; a cycloalkyl group, e.g., cyclohexyl; an aryl group, e.g., phenyl; an aralkyl group, e.g., benzyl; and a triorganosiloxy group of formula $(R')_3SiO—$, in which R' is methyl or phenyl. Specifically preferred are wherein $R^1$, $R^2$, and R' represents a methyl group.

The oxyalkylene polymer contains at least one, preferably 1.1 to 5 reactive silicon groups per molecule. If the number of the reactive silicon group per molecule is less than 1, the polymer has insufficient curability, failing to possess satisfactory rubbery elasticity.

The reactive silicon group may be placed either at the terminal or in the inside of the molecular chain of the oxyalkylene polymer. An oxyalkylene polymer having the reactive silicon group at the molecular terminal thereof is liable to provide a rubbery cured product having high tensile strength and low elasticity.

The oxyalkylene polymer which can be used in the present invention as component (a) comprises a group represented by formula (3):

—(R—O)$_m$—           (3)

wherein R represents a divalent alkylene group having 2 to 4 carbon atoms; m is an integer, and at least one reactive silicon group of formulae (1) or (2) as described above.

From the viewpoint of availability, an oxyalkylene polymer group having a repeating unit represented by formula (4) is preferable:

—CH(CH$_3$)CH$_2$O—           (4),

The above oxyalkylene polymer may have a straight-chain structure or a branched structure or a mixed structure thereof. Other monomer units may be contained but preferably the monomer unit of formula (4) comprises at least 50% by weight, more preferably 80% or more by weight of the polymer.

Oxyalkylene polymers having a number average molecular weight (Mn) of 3,000 or more are effectively usable. Those having an Mn of 6000 to 50,000, particularly 10,000 to 30,000, are preferred. The ratio of weight average molecular weight (Mw) to number average molecular weight (Mw/Mn) is not higher than 1.6, which indicates that the polymer has an extremely narrow molecular weight distribution (i.e., highly monodisperse). The Mw/Mn ratio is preferably not higher than 1.5, still preferably not higher than 1.4. While molecular weight distribution is measurable by various methods, it is generally measured by gel-permeation chromatography (GPC). Since the composition of the present invention has such a narrow molecular weight distribution in spite of a great number average molecular weight, it has a low viscosity and is easy to handle before curing while showing satisfactory rubbery elastic behavior after curing.

The oxyalkylene polymer having a reactive silicon group is preferably obtained by introducing a reactive silicon group into the above-mentioned oxyalkylene group having a functional group.

Introduction of a reactive silicon group can be carried out in a conventional manner, for example, as follows.

(I) A precursor of an oxyalkylene polymer having a functional group, such as a hydroxyl group, is reacted with an organic compound having a reactive group to the functional group and an unsaturated group to obtain an oxyalkylene polymer having the unsaturated group. Alternatively, the oxyalkylene polymer is copolymerized with an unsaturated group-containing epoxy compound to obtain an unsaturated group-containing oxyalkylene polymer. The resulting reaction product is then hydrosilylated with a hydrosilane having a reactive silicon group.

(II) An unsaturated group-containing oxyalkylene polymer obtained in the same manner as in (I) above is reacted with a compound having a mercapto group and a reactive silicon group.

(III) A precursor of an oxyalkylene polymer having a functional group, such as a hydroxyl group, an epoxy group or an isocyanate group (hereinafter referred to as a Y functional group), is reacted with a silicon compound having a functional group reactive to the Y functional group (hereinafter referred to as a Y' functional group).

The silicon compounds having a Y' functional group are known to those skilled in the art and include, but are not limited to, an amino group containing silane, such as γ-(2-)aminoethyl) aminopropyltrimethoxysilane, γ-(2-)aminoethyl) aminopropylmethyldimethoxysilane or γ-aminopropyltriethoxysilane; a mercapto group containing silane, such as γ-mercaptopropyltrimethoxysilane or γ-mercaptopropylmethyldimethoxysilane; an epoxysilane, such as γ-glycidoxypropyltrimethoxysilane or β- (3,4-epoxycyclohexyl)ethyltrimethoxysilane; a vinyl type unsaturated group-containing silane, such as vinyltriethoxysilane, γ-methacryloyloxypropyltrimethoxysilane or γ-acryloyloxypropylmethyldimethoxysilane; a chlorine-containing silane, such as γ-chloropropyltrimethoxysilane; an isocyanate-containing silane, such as γ-isocyanatopropyltriethoxysilane or γ-isocyanatopropylmethyldimethoxysilane; and a hydrosilane, such as methyldimethoxysilane, trimethoxysilane or methyldiethoxysilane. The silicon compounds containing a Y' functional group are by no means limited to these examples.

Among the above-mentioned methods, method (I) and a method of method (III) in which a polymer having a hydroxyl group at the terminal thereof is reacted with a silicon compound having an isocyanate group are preferred.

While not limiting, the above-described reactive silicon group-containing oxyalkylene polymers typically include those disclosed in JP-A-50-156599, JP-A-54-6069, JP-A-57-126823, JP-A-59-78223, JP-A-55-82123, JP-A-55-131022, JP-A-55-47825, JP-A-62-230822, JP-A-63-83131, JP-A-3-47825, JP-A-3-72527, JP-A-3-122152, U.S. Pat. Nos. 3,632,557, 4,345,053, 4,366,307, and 4,960,844, which are incorporated by reference herein in their entireties.

The curing catalyst as component (b), which is used to cure the oxyalkylene polymer having at least one reactive silicon group per molecule, is a catalyst for making the oxyalkylene polymer into a three-dimensional network structure, that is, curing the polymer to obtain a solid with rubbery elasticity. A broad range of known silanol condensation catalysts (curing catalysts) known to those skilled in the art can be employed as component (b). Suitable examples of silanol condensation catalysts include, but are not limited to, titanic esters, such as tetrabutyl titanate and tetrapropyl titanate; tin carboxylates, such as dibutyltin dilaurate, dibutyltin maleate, dibutyltin diacetate, tin octylate, tin naphthenate, tin laurate, and tin fersatate; a reaction product of dibutyltin oxide and a phthalic ester; dibutyltin diacetylacetonate; organoaluminum compounds, such as trisacetylacetonatoaluminum, tris(ethylacetoacetato) aluminum, and ethylacetoacetatodiisopropoxyaluminum; chelate compounds, such as tetraacetylacetonatozirconium and tetraacetylacetonatotitanium; lead octylate; iron naphthenate; bismuth compounds, such as bismuth tris (neodecanoate) and bismuth tris(2-ethylhexoate); amine compounds, such as butylamine, octylamine, dibutylamine, monoethanolamine, diethanolamine, triethanolamine, diethylenetriamine, triethylenetetramine, oleylamine, cyclohexylamine, benzylamine, diethylaminopropylamine, xylylenediamine, triethylenediamine, guanidine, diphenylguanidine, 2,4,6-tris(dimethylaminomethyl)phenol, morpholine, N-methylmorpholine, 2-ethyl-4-methylimidazole, and 1,8-diazabicyclo(5.4.0)undecene-7 (DBU); salts of these amine compounds with a carboxylic acid, etc.; low-molecular polyamide resins obtained from an excess polyamine and a polybasic acid; a reaction product of an excess polyamine and an epoxy compound; silane coupling agents having an amino group, such as γ-aminopropyltrimethoxysilane and N-(β-aminoethyl) aminopropylmethyldimethoxysilane; and other acidic catalysts and basic catalysts. These catalysts may be used either individually or as a combination of two or more thereof.

The (silanol condensation) curing catalyst is used in an amount preferably of from 0.1 to 20 parts by weight, more preferably of from 1 to 10 parts by weight, per 100 parts by weight of the oxyalkylene polymer. If the amount of the silanol condensation catalyst is too small with respect to the oxyalkylene polymer, a curing rate becomes low, and a curing reaction hardly proceeds sufficiently. On the other hand, the amount of the curing silanol condensation catalyst is too large with respect to the oxyalkylene polymer, a curing tends to be accompanied with local generation of heat or foam, thereby failing to provide a satisfactory cured product.

The epoxy resin which can be used in the present invention as component (c) includes flame retardant epoxy resins, such as, but not limited to, epichlorohydrin-bisphenol A epoxy resin, epichlorohydrin-bisphenol F epoxy resin, and tetrabromobisphnol A glycidyl ether; epoxy-novolak resins, hydrogenated bisphenol A epoxy resins, bisphenol A propylene oxide adduct glycidyl ether type epoxy resins, o-hydroxybenzoic acid glycidyl ether ester type epoxy resins, m-aminophenol epoxy resins, diaminodiphenylmethane epoxy resins, urethane-modified epoxy resins, various alicyclic epoxy resins; glycidyl ethers of polyhydric alcohols, such as N,N-diglycidylaniline, N,N-diglycidyl-o-toluidine, triglycidyl isocyanurate, polyalkylene glycol diglycidyl ethers, and glycerin; hydantoin type epoxy resins; and epoxides of unsaturated polymers such as petroleum resins. The epoxy resins are not limited to these examples, and commonly employed epoxy resins may be used. Of these epoxy resins preferred are those containing at least two epoxy groups represented by the formula (5):

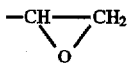
(5)

per molecule; for they have high reactivity in curing and easily form a three-dimensional network structure in the cured product. Still preferred are bisphenol A epoxy resins and novolak epoxy resins.

Epoxy resin (c) and oxyalkylene polymer (a) are used at a (a)/(c) ratio of from 100/1 to 1/100 by weight. If the (a)/(c) ratio is less than 1/100, the effects for improving in an impact strength and toughness of the cured epoxy resin are hardly obtained. If the (a)/(c) ratio exceeds 100/1, the tensile strength of a cured oxyalkylene polymer becomes insufficient. While a preferred (a)/(c) ratio varies according to the use of the curable resin composition and is not definitely specified, where improvements in impact resistance, flexibility, toughness and peeling strength of a cured product of epoxy resin (c) are aimed at, it is recommended to use 1 to 100 parts by weight, preferably 5 to 100 parts by weight, of component (a) per 100 parts by weight of component (c). Where an improvement in tensile strength of a cured product of oxyalkylene polymer (a) is aimed at, use of 1 to 200 parts by weight, preferably 5 to 100 parts by weight, of component (c) per 100 parts by weight of component (a) is recommended.

The ketimine which can be used in the present invention as component (d) is a compound having a functional group represented by the formula (6):

(6)

wherein $R^3$ and $R^4$ each independently represents a hydrogen atom, a branched or straight chain alkyl group having 1 to 6 carbon atoms or a phenyl group.

The ketimines exist stably in a water-free condition but decompose in the presence of water into a primary amine and a ketone, and the resultant primary amine serves as an agent for room temperature curing of an epoxy resin.

Such ketimines include compounds represented by formula

(7)

wherein $R^3$ and $R^4$ each independently represents a hydrogen atom, a branched or straight chain alkyl group having 1 to 6 carbon atoms or a phenyl group; Z represents an organic group; and l represents 1, 2 or 3.

The compounds of formula (7) can be obtained by condensation between an amine compound and a carbonyl compound.

Known amine compounds and carbonyl compounds can be used for ketimine synthesis. Examples of useful amine compounds include but are not limited to diamines, such as ethylenediamine, propylenediamine, trimethylenediamine, tetramethyenediamino, 1,3-diaminobutane, 2,3-diaminobutane, pentamethylenediamine, 2,4-diaminopentane, hexamethylenediamine, p-phenylenediamine, and p,p'- biphenylenediamine; polyamines, such as 1,2,3-triaminopropane, triaminobenzene, tris(2-aminoethyl)amine, and tetra (aminomethyl)methane; polyalkylenepolyamines, such as diethylenetriamine, triethylenetriamine, and tetraethylenepentamine; polyoxyalkylenepolyamines; and aminosilanes, such as γ-aminopropyltriethoxysilane, N-(β-aminoethyl)-γ-aminopropyltrimethoxysilane, and N-(β-aminoethyl)-γ-aminopropylmethyldimethoxysilane. Examples of usable carbonyl compounds include but are not limited to aldehydes, such as acetaldehyde, propionaldehyde, n-butylaldehyde, isobutylaldehyde, diethylacetaldehyde, glyoxal, and benzaldehyde; cyclic ketones, such as cyclopentanone, trimethylcyclopentanone, cyclohexanone, and trimethylcyclohexanone; aliphatic ketones, such as acetone, methyl ethyl ketone, methyl propyl ketone, methyl isopropyl ketone, methyl isobutyl ketone, diethyl ketone, dipropyl ketone, diisopropyl ketone, dibutyl ketone, and diisobutyl ketone; and β-dicarbonyl compounds, such as acetylacetone, methyl acetoacetate, ethyl acetoacetate, dimethyl malonate, diethyl malonate, methylethyl manolate, and dibenzoylylmethane.

Where a ketimine contains an imino group, the imino group may be reacted with styrene oxide; a glycidyl ether, such as butyl glycidyl ether or allyl glycidyl ether; or a glycidyl ester.

These ketimines may be used either individually or as a combination of two or more thereof. An amount of the ketimines to be used ranges from 1 to 100 parts by weight per 100 parts by weight of the epoxy resin, while depending on the kinds of the epoxy resin and the ketimine.

The reactive silicon group-containing silane compound which can be used in the present invention as component (e) is a low-molecular silicon compound having a hydrolyzable functional group which undergoes reaction in the presence of moisture and preferably having a molecular weight of not more than 500.

The hydrolyzable functional group includes an alkoxy group, an acyloxy group, a ketoximate group, an amino group, an amino-oxy group, an amido group, and an alkenyloxy group. Examples of substituents include but are not limited to an epoxy-containing group, an amino-containing group, an acryl-containing group, and a mercapto-containing group. Preferred are $Si(OC_2H_5)_4$, $CH_2=CHSi(OAc)_3$, $CH_3—Si[ON=C(CH_3)(C_2H_5)]_3$, $CH_3Si[N(CH_3)_2]_3$, $CH_3Si[N(CH_3)(C_2H_5)]_3$, $CH_3Si[N(CH_3)Ac]_3$, $CH_3Si[OC(C_2H_5)=CH_2]_3$, $CH_2(O)CHCH_2O(CH_2)_3Si(OCH_3)_3$, $CH_2=CH_2Si(OCH_3)_3$, $CH_2=C(CH_3)COO(CH_2)_3Si(OCH_3)_3$, $HS(CH_2)_3Si(OCH_3)_3$, $H_2N(CH_2)_3Si(OCH_3)_3$, $H_2N(CH_2)_2NH(CH_2)_3Si(OCH_3)_3$, $H_2N(CH_2)_2NH(CH_2)_3Si(CH_3)(OCH_3)_2$, and $(C_2H_5O)_3Si(CH_2)_3NH(CH_2)_2NH(CH_2)_3Si((OCH_3)_3$. These silane compounds may be used either individually or as a combination of two or more thereof.

The silane compound is preferably used in an amount of 0.01 to 20 parts by weight per 100 parts by weight of the oxyalkylene polymer. If it is less than 0.01 part by weight, the expected adhesion can hardly be obtained. Amounts exceeding 20 parts by weight adversely affect the rubber properties after curing.

The curable resin composition according to the present invention preferably further comprises (f) a desiccant in addition to the effective components (a) to (e). A desiccant is used not only for preventing the oxyalkylene polymer from undergoing hydrolysis to form a three-dimensional network structure through silanol condensation during storage but also for preventing the ketimine from being decomposed with water and reacting with the epoxy resin to cure.

The desiccant which can be used in the present invention is not particularly limited, and those having a general dehydrating effect are usable. Examples of suitable desiccants include but are not limited to vinylsilanes, such as vinyltrimethoxysilane and vinyltriethoxysilane; acrylsilanes, such as γ-methacryloxpropyltrimethoxysilane; silicates, such as methyl silicate and ethyl silicate; and orthoformic esters. The desiccant is preferably used in an amount of 0.1 to 20 parts by weight per 100 parts by weight of the oxyalkylene polymer. If the amount is less than 0.1 part by weight, the expected dehydrating effect is hardly produced. Amounts exceeding 20 parts by weight adversely affect curing properties.

If desired, the curable resin composition according to the present invention may further contain various fillers, plasticizers, antioxidants, ultraviolet absorbents, lubricants, pigments, foaming agents, and the like.

Suitable fillers include reinforcing fillers, such as fumed silica, precipitated silica, silicic anhydride, and carbon black; fillers, such as calcium carbonate, magnesium carbonate, diatomaceous earth, calcined clay, clay, talc, hardened titanium, bentonite, organic bentonite, ferric oxide, zinc oxide, active zinc oxide, hydrogenated castor oil, and silas balloons; and fibrous fillers, such as asbestos and glass fibers or filaments.

When a filler is used for obtaining a high strength cured product, a favorable result may be obtained by using 1 to 100 parts by weight of a filler selected mainly from fumed silica, precipitated silica, silicic anhydride, hydrous silicic acid and also from carbon black, surface-treated finely divided calcium carbonate, calcined clay, clay, and active zinc oxide per 100 parts by weight of the oxyalkylene polymer. When a cured product having low strength and high extensibility is desired, a favorable result may be obtained by using 5 to 200 parts by weight of a filler selected mainly from titanium oxide, calcium carbonate, magnesium carbonate, talc, ferric oxide, zinc oxide, and silas balloons per 100 parts by weight of the oxyalkylene polymer. As a matter of course, these fillers may be used either individually or as a mixture of two or more thereof.

Methods of molding the curable resin composition according to the present invention are not particularly restricted. Where the proportion of component (c) is higher than that of component (a), the resin composition is preferably molded by a molding method, generally employed for epoxy resins, such as but not limited to compression molding, transfer molding and injection molding. When molded by these methods, the resin composition provides molded articles and laminated moldings, such as copper-plated laminates or reinforced wood, showing improvements in impact resistance, flexibility, and toughness. The resin composition having the above-mentioned composition is also suited for use as an adhesive having improved peeling strength, a foaming material having improved flexibility, a binder for fiber boards or particle boards, a coating, a binder for shell molding, a binder for brake lining, a binder for grinding wheels, and a matrix of composite materials containing glass fiber or carbon fiber.

Where the proportion of component (a) is higher than that of component (c), on the other hand, the resin composition is preferably molded by a method generally used for solid rubber such as but not limited to natural rubber or liquid rubber polymers such as polyurethane. When molded by these methods, the resin composition is suited for use as a rubber adhesive having improved strength, a sealant, a pressure-sensitive adhesive, etc.

The present invention provides a one-pack type curable composition which is superior to conventional curable resin compositions in balance among rubbery elasticity, adhesion, and strength, rapid curability, and storage stability. Use of an oxyalkylene polymer having a urethane bond or a urea bond provides a curable composition excellent in water-resistant adhesion.

The curable resin composition of the present invention will now be illustrated with reference to Examples.

The present invention will be described in greater detail by way of Synthesis Examples and Examples, but it should be understood that the present invention is not limited thereto.

SYNTHESIS EXAMPLE 1

One mole of polypropylenetriol having a number average molecular weight of 15,000 (Mw/Mn=1.38; viscosity: 89 poise) and 3 mol of γ-isocyanatopropylmethyldimethoxysilane were reacted in the presence of dibutyltin dilaurate to obtain a colorless transparent polymer. The IR spectrum was evaluated before and after the reaction. As a result, disappearance of the absorption due to NCO at around 2280 cm$^{-1}$ and appearance of absorption due to C=O at about 1730 cm$^{-1}$ lent confirmation to the production of an oxyalkylene polymer having a methyldimethoxysilyl group at the molecular terminal thereof.

SYNTHESIS EXAMPLE 2

Polypropylene glycol having a number average molecular weight of 15,000 (Mw/Mn=1.26; viscosity: 110 poise) was treated with sodium methoxide and then reacted with allyl chloride to convert the terminal hydroxyl group to an unsaturated group.

One mole of the resulting unsaturated group-terminated polyoxyalkylene was reacted with 2 mol of dimethoxymethylsilane in the presence of chloroplatinic acid to obtain a yellow transparent polymer. The amount of hydrogenated silicon in the reaction solution was determined by IR spectroscopic analysis and, as a result, production of an oxyalkylene polymer having a methyldimethoxysilyl group at the molecular terminal thereof was confirmed.

COMPARATIVE SYNTHESIS EXAMPLE 1

A mixture of polypropylene glycol (number average molecular weight: 2,500 and polypropylenetriol (number average molecular weight: 3,000) was used as a starting material. The mixture was treated with sodium methoxide, subjected to molecular weight jumping using methylene chloride, and reacted with allyl chloride to convert the terminal hydroxyl group to an unsaturated group.

One mole of the resulting unsaturated group-terminated polyoxyalkylene was reacted with 2 mol of dimethoxymethylsilane in the presence of chloroplatinic acid to obtain a yellow transparent polymer. The amount of hydrogenated silicon in the reaction solution was determined by IR spectroscopic analysis and, as a result, production of an oxyalkylene polymer having a methyldimethoxysilyl group at the molecular terminal thereof was confirmed.

The viscosity of the polymers obtained in Synthesis Examples 1 and 2 and Comparative Synthesis Example 1 was measured with a Brookfield viscometer (BM type rotor No. 4; 12 rpm) at 23° C. The number average molecular weight (Mn) and the molecular weight distribution (Mw/Mn) of each polymer were analyzed by gel-permeation chromatography (GPC). GPC was carried out by using a column packed with polystyrene gel (produced by Tosoh Corp.) and tetrahydrofuran as an eluent at an oven temperature of 40° C. The results obtained are shown in Table 1.

TABLE 1

| Polymer | Viscosity (poise) | Number Average Molecular Weight (Mn) | Molecular Weight Distribution (Mw/Mn) |
| --- | --- | --- | --- |
| Synthesis Example 1 | 150 | $1.7 \times 10^4$ | 1.4 |
| Synthesis Example 2 | 160 | $1.8 \times 10^4$ | 1.3 |
| Comparative Example 1 | 240 | $1.5 \times 10^4$ | 2.3 |

Preparation of One-Pack Curable Composition

The polymer obtained in Synthesis Example 1 or 2 or Comparative Synthesis Example 1 was mixed with an epoxy resin (bisphenol A epoxy resin, Epikoat 828, produced by Yuka Shell Epoxy K. K.), Noclak SP (phenolic antioxidant produced by Ouchi Shinko Kagaku Kogyo K. K.), calcium carbonate, and titanium oxide by stirring under reduced pressure. To the mixture were added vinyltrimethoxysilane (A-171, produced by Nippon Unicar Co., Ltd.) as a desiccant, N-β(aminoethyl)-γ-aminopropylmethyldimethoxysilane as a silane compound, ketimine (H-3, produced by Yuka Shell Epoxy K. K.), and a dibutyltin compound (#918, produced by Sankyo Yuki Gosei K. K.) as a curing catalyst for an oxyalkylene polymer, and the mixture was stirred under reduced pressure to obtain the composition of the present invention.

Evaluation of Physical Properties

Physical Properties of Cured Product

The above prepared composition was spread to a thickness of 2 mm and allowed to cure at 23° C. for 2 days and then at 50° C. for 3 days. A No. 3 dumbbell specimen according to JIS K6301 was prepared from the resulting sheet, and a tensile test was conducted at a pulling speed of 200 mm/min to measure a strength at break and an elongation at break.

Adhesion

A test specimen for tensile shear strength measurement in accordance with JIS K6850 was prepared by applying the above composition to one of two JIS H4000 aluminum plates A-1050P (100×25×2 mm) with a spatula and adhering the plates by manually pressing. After curing the specimen at 23° C. for 2 days and then at 50° C. for 3 days, a tensile shear test was conducted to evaluate dry adhesion. The specimen was further aged in water at 23° C. for 7 days and subjected to a tensile shear test while wet to evaluate water-resistant adhesion. The adhesion was evaluated according to the following standard.

0 . . . A cohesive failure occurs.

Δ . . . A cohesive failure together with an interfacial failure occurs.

x . . . An interfacial failure occurs.

Curability

The above composition was spread at 23° C. and 50% RH to a thickness of about 3 mm, and the time required for the surface of the sheet to be cured was evaluated with a finger touch.

Storage Stability

The above composition was charged in a cartridge and sealed. The viscosity of the composition was measured immediately after the charging and after preservation at 50° C. for 7 days or 21 days. The storage stability was evaluated according to the following standard.

0 . . . No change is observed.

Δ . . . An increase in viscosity is observed.

x . . . Gelation is observed.

TABLE 2

| | Example 1 | Example 2 | Example 3 | Example 4 | Example 5 | Compara. Example 1 | Compara. Example 2 |
|---|---|---|---|---|---|---|---|
| Composition (part by wt.): | | | | | | | |
| Oxyalkylene polymer: | | | | | | | |
| Synthesis Example 1 | 100 | 100 | 100 | | | | |
| Synthesis Example 2 | | | | 100 | 100 | | |
| Compara. Synthesis Example 1 | | | | | | 100 | 100 |
| Curing agent for oxyalkylene polymer | 1 | 1 | 1 | 1 | 1 | 1 | 1 |
| Epoxy resin | 50 | 100 | 100 | 50 | 100 | 50 | 100 |
| Ketimine | 23 | 23 | 46 | 23 | 46 | 23 | 46 |
| Silane compound | 1 | 1 | 1 | 1 | 1 | 1 | 1 |
| Vinyltrimethoxysilane | 3 | 3 | 3 | 3 | 3 | 3 | 3 |
| Calcium carbonate | 100 | 100 | 100 | 100 | 100 | 100 | 100 |
| Titanium oxide | 20 | 20 | 20 | 20 | 20 | 20 | 20 |
| Nocrac Sp | 1 | 1 | 1 | 1 | 1 | 1 | 1 |
| Physical Properties: | | | | | | | |
| JIS No. 3 dumbbell: | | | | | | | |
| Strength at break (kgf/cm$^2$) | 31 | 26 | 41 | 23 | 30 | 18 | 26 |
| Elongation at break (%) | 260 | 320 | 200 | 370 | 240 | 100 | 60 |
| Dry adhesion/water-resistant adhesion | O/O | O/O | O/O | O/△ | O/O | O/△x | O/△x |
| Curability (min) | 30–60 | 90–150 | 60–90 | 30–60 | 60–90 | 60–120 | 120–180 |
| Storage stability: | | | | | | | |
| Immediately after charging | O | O | O | O | O | O | O |
| 50° C. × 7 days | O | O | O | O | O | O | O |
| 50° C. × 21 days | O | O | O | O | O | O△ | O△ |

As is apparent from Table 2, it can be seen that use of the oxyalkylene polymer of the present invention having an Mw/Mn ratio of not more than 1.6 provides a composition having a markedly improved balance between rubbery elasticity and strength, excellent adhesion properties, accelerated curability, and excellent storage stability.

It is also seen that the composition using the urea bond-containing oxyalkylene polymer of Example 1, 2 or 3 is excellent in water-resistant adhesion as well.

While the invention has been described in detail and with reference to specific embodiments thereof, it will be apparent to one skilled in the art that various changes and modifications can be made therein without departing from the spirits and scope thereof.

What is claimed:

1. A curable resin composition comprising:

(a) an oxyalkylene polymer having a number average molecular weight (Mn) of 3000 or more and an Mw/Mn ratio of 1.6 or less comprised of (i) a group represented by the formula (3):

—(R—O)$_m$—  (3)

wherein R is an divalent alkylene group of 2 to 4 carbon atoms and m is an integer;

(ii) at least one reactive silicon group of the formulae (1) or (2):

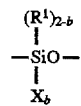

(1)

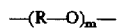

(2)

wherein R$^1$ and R$^2$ are independently:
    a straight, branched or cyclic alkyl group of 1 to 20 carbon atoms, an aryl group of 6 to 20 carbon atoms, an aralkyl of 7 to 20 carbon atoms, or a triorganosiloxy group of the formula: (R$^1$)$_3$SiO—, wherein each R' may be the same or different and represents phenyl or monovalent hydrocarbon group of 1 to 20 carbon atoms; may be the same or different and is a hydroxyl group or a hydrolyzable group:
    a is 0 or an integer from 1 to 3; b is 0, 1 or 2; and a +Σb≧1;

(b) a curing catalyst comprised of at least one reactive silicon group per molecule of the formula (1) or (2) as described above;

(c) an epoxy resin; and (d) a ketimine.

2. The curable resin composition of claim 1 further comprising (e) a reactive silicon group-containing silane compound.

3. The curable resin composition of claim 1 further comprising (f) a desiccant.

4. The curable resin composition of claim 1 wherein the oxyalkylene polymer (a) has a number average molecular weight of 1000 or more.

5. The curable resin composition of claim 2 wherein the oxyalkylene polymer (a) has a number average molecular weight of 1000 or more.

6. The curable resin composition of claim 3 wherein the oxyalkylene polymer (a) has a number average molecular weight of 1000 or more.

7. The curable resin composition of claim 1 wherein X in formula (1) or (2) is alkoxy so that the oxyalkylene polymer (a) comprises an alkoxysilyl group.

8. The curable resin composition of claim 1 wherein $R^1$ or $R^2$ in formula (1) or (2) of the oxyalkylene polymer (a) is methyl, ethyl, phenyl, benzyl, $(CH_3)_3SiO—$ or $(phenyl)_3SiO—$.

9. The curable resin composition of claim 1 wherein R in formula (3) of the oxyalkylene polymer (a) is $—CH(CH_3)CH_2—$.

10. The curable resin composition of claim 1 wherein the oxyalkylene polymer (a) further comprises a urethane bond or urea bond.

11. The curable resin composition of claim 1 wherein the composition is comprised of a one-pack form.

12. The curable resin composition of claim 2 wherein the composition is comprised of a one-pack form.

13. The curable resin composition of claim 3 wherein the composition is comprised of a one-pack form.

* * * * *